United States Patent [19]
Yamamoto et al.

[11] Patent Number: 6,108,213
[45] Date of Patent: Aug. 22, 2000

[54] RETAINER FOR ELECTRONIC APPARATUS

[75] Inventors: Satoru Yamamoto; Tosiki Yamanaka, both of Shizuoka, Japan

[73] Assignee: NEC Corporation, Tokyo, Japan

[21] Appl. No.: 09/333,969

[22] Filed: Jun. 16, 1999

[30] Foreign Application Priority Data

Jun. 22, 1998 [JP] Japan .................................. 10-175034

[51] Int. Cl.$^7$ ...................................................... H05K 1/11
[52] U.S. Cl. ........................... 361/784; 361/814; 361/807; 455/575; 455/90; 343/895; 343/744; 379/433
[58] Field of Search .................................... 361/784, 814, 361/807; 455/575, 90, 572, 773; 379/433; 343/895, 744

[56] References Cited

U.S. PATENT DOCUMENTS

| | | | |
|---|---|---|---|
| 5,493,702 | 2/1996 | Crowley et al. | 455/89 |
| 5,517,583 | 5/1996 | Collett et al. | 455/89 |
| 5,561,436 | 10/1996 | Phillips | 343/702 |
| 5,561,437 | 10/1996 | Phillips et al. | 343/702 |
| 5,659,889 | 8/1997 | Cockson | 455/575 |
| 5,802,458 | 9/1998 | Van Zeijl et al. | 455/90 |
| 5,887,197 | 3/1999 | Ricardo et al. | 455/575 |
| 5,960,332 | 9/1999 | Michalzik | 455/90 |
| 6,011,699 | 1/2000 | Murray et al. | 361/814 |

FOREIGN PATENT DOCUMENTS

| | | |
|---|---|---|
| 63-55637 | 4/1988 | Japan . |
| 4-211198 | 8/1992 | Japan . |
| 5-31368 | 4/1993 | Japan . |
| 6-164465 | 6/1994 | Japan . |
| 7-250138 | 9/1995 | Japan . |
| 9-163436 | 6/1997 | Japan . |
| 9-270717 | 10/1997 | Japan . |

*Primary Examiner*—Jeffrey Gaffin
*Assistant Examiner*—David Foster
*Attorney, Agent, or Firm*—Sughrue, Mion, Zinn, Macpeak & Seas, PLLC

[57] ABSTRACT

A retainer for an electronic apparatus includes a housing member in the form of a frame, an antenna holding member, and rib elements for assuring a distance between a main printed board and a sub-printed board. The housing member, antenna holding member and rib elements are formed as one unit of a resin material. The housing member accommodates and holds a liquid crystal display unit, an EL lamp and so forth. The antenna holding member supports an inner side portion of a loop antenna. The rib elements hold the sub-printed board to assure the distance between the main printed board and the sub-printed board. By forming the retainer as one unit of a resin material, the number and cost of parts can be reduced, and moreover assembly and disassembly are facilitated and the number of working steps can be reduced.

3 Claims, 8 Drawing Sheets

RETAINER FOR ELECTRONIC APPARATUS

BACKGROUND OF THE INVENTION

1. Field of the Invention

This invention relates to a retainer for an electronic apparatus for holding a display unit, a board and an antenna of the electronic apparatus.

2. Description of the Related Art

A retainer for an electronic apparatus shown in FIG. 1 is known as a retainer for an electronic apparatus of the type described above according to a prior art. The retainer for an electronic apparatus according to the prior art is disclosed in Japanese Utility Model Laid-Open No. 31368/1993. The retainer for an electronic apparatus according to the prior art is constructed such that antenna spacer 103 and board spacers 104 extend from housing 102 on which liquid crystal panel 101 is held.

In particular, six board spacers 104 of housing 102 disposed on main circuit board 105 and holding liquid crystal panel 101 thereon extend through six insertion holes 106 of main circuit board 105 until ends thereof abuts against sub-circuit board 109 in such a way that a fixed space is formed for accommodating the circuit parts three-dimensionally between main circuit board 105 and sub-circuit board 109. Also antenna spacer 103 projects horizontally from housing 102 and extends downward through insertion hole 110, supporting between its top surface and its lower end surface, central portions of antenna 108 of a rectangular shape from the inner sides to keep the loop distance of antenna spacer 103 fixed. Further, the opposite ends of antenna 108 are held by main circuit board 105. Housing 102 and main circuit board 105 are fixed and integrated with each other by fixing elements 111 of panel holding plate 107.

The retainer for an electronic apparatus according to the prior art described above is disadvantageous in that it is not suitable for miniaturization weight reduction and the increasingly high performance of electronic apparatus in recent years, because the many insertion holes 106 in main circuit board 105 restrict arrangement and wiring of electronic parts.

Further, the retainer for an electronic apparatus according to the prior art described above is disadvantageous also in that two parts of housing 102 and panel holding plate 107 are fixed to main circuit board 105.

Further, in assembly of the retainer for an electronic apparatus according to the prior art described above, antenna 108 is attached last. However, if a failure originating from a part on main circuit board 105 or sub-circuit board 109 occurs in a later inspection or after use, antenna 108 must be removed in order to perform repair and attached again. Therefore, the retainer for an electronic apparatus is disadvantageous also in that much time is required for repair.

SUMMARY OF THE INVENTION

It is a first object of the present invention to provide a retainer for an electronic apparatus in which the number and cost can be reduced.

It is a second object of the present invention to provide a retainer for an electronic apparatus suitable for miniaturization.

It is a third object of the present invention to provide a retainer for an electronic apparatus which facilitates assembly and disassembly and can reduce the number of working steps.

A retainer for an electronic apparatus of the present invention comprises a housing member in the form of a frame having a substantially rectangular shape in plan for accommodating and holding a display member, an antenna holding member positioned perpendicularly to the housing member in the form of a frame along the outer side of one edge of the housing member, and rib elements provided on the antenna holding member for assuring a distance between a main printed board and a sub-printed board both placed on the housing member, the housing member, the antenna holding member and the rib elements being formed as one member of a resin material.

With the retainer for an electronic apparatus of the present invention, since the housing member, the antenna holding member and the rib elements are formed as one member of a resin material, the number of parts and the part cost can be reduced.

Further, the retainer for an electronic apparatus of the present invention is suitable for miniaturization of the electronic apparatus because the printed boards are held by pawl elements and/or hook members.

Further, with the retainer for an electronic apparatus of the present invention, because the printed boards are held by the pawl elements and/or the hook members, assembly and disassembly of the main printed board and the sub-printed board can be performed readily in a condition wherein parts on the main printed board and the sub-printed board remain attached. Consequently, assembly and disassembly are facilitated and the number of working steps can be reduced.

The above and other objects, features, and advantages of the present invention will become apparent from the following description based on the accompanying drawings which illustrate an example of a preferred embodiment of the present invention.

DETAILED DESCRIPTION OF THE PREFERRED EMBODIMENTS

Figure 1:
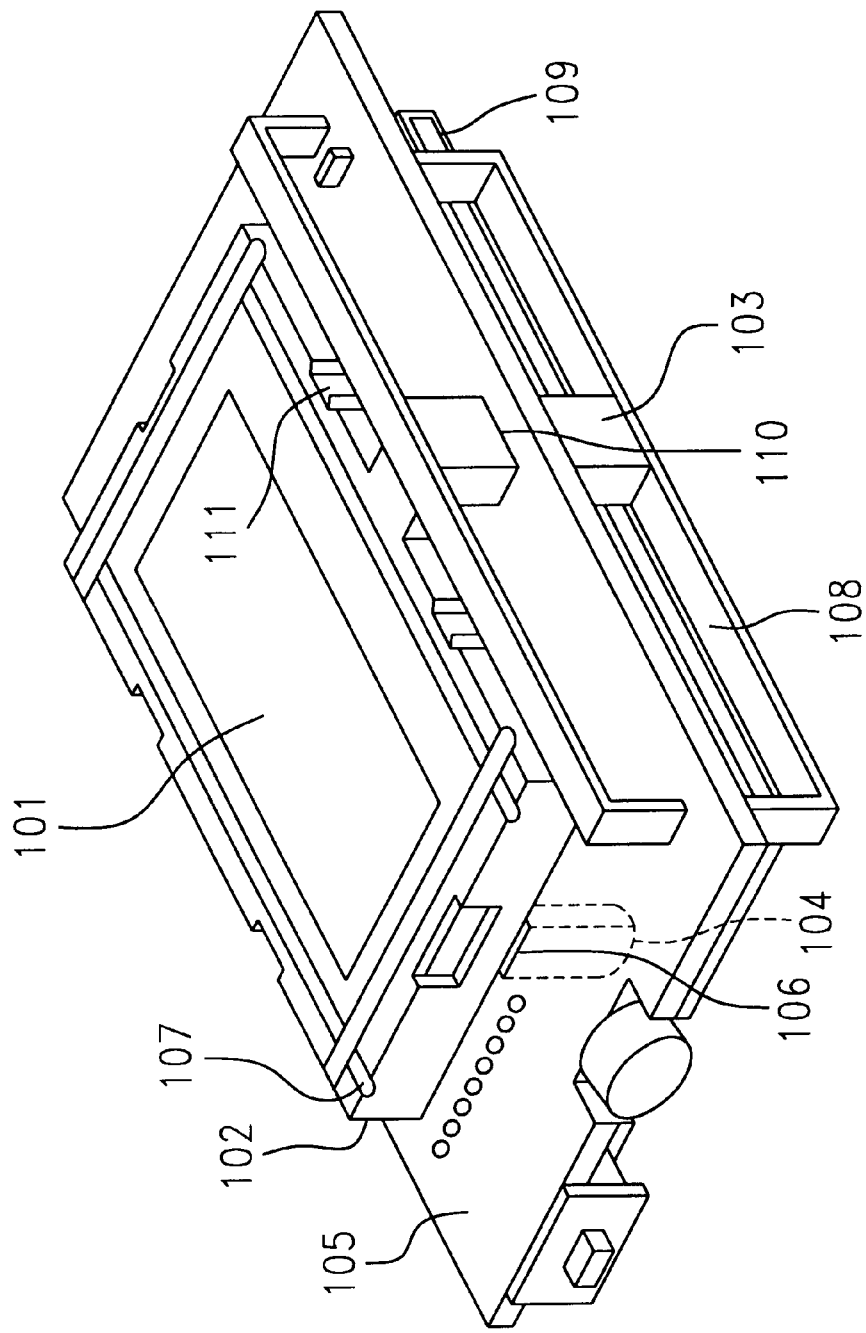
FIG. 1 is a perspective view showing a retainer for an electronic apparatus according to a prior art.
Figure 2:
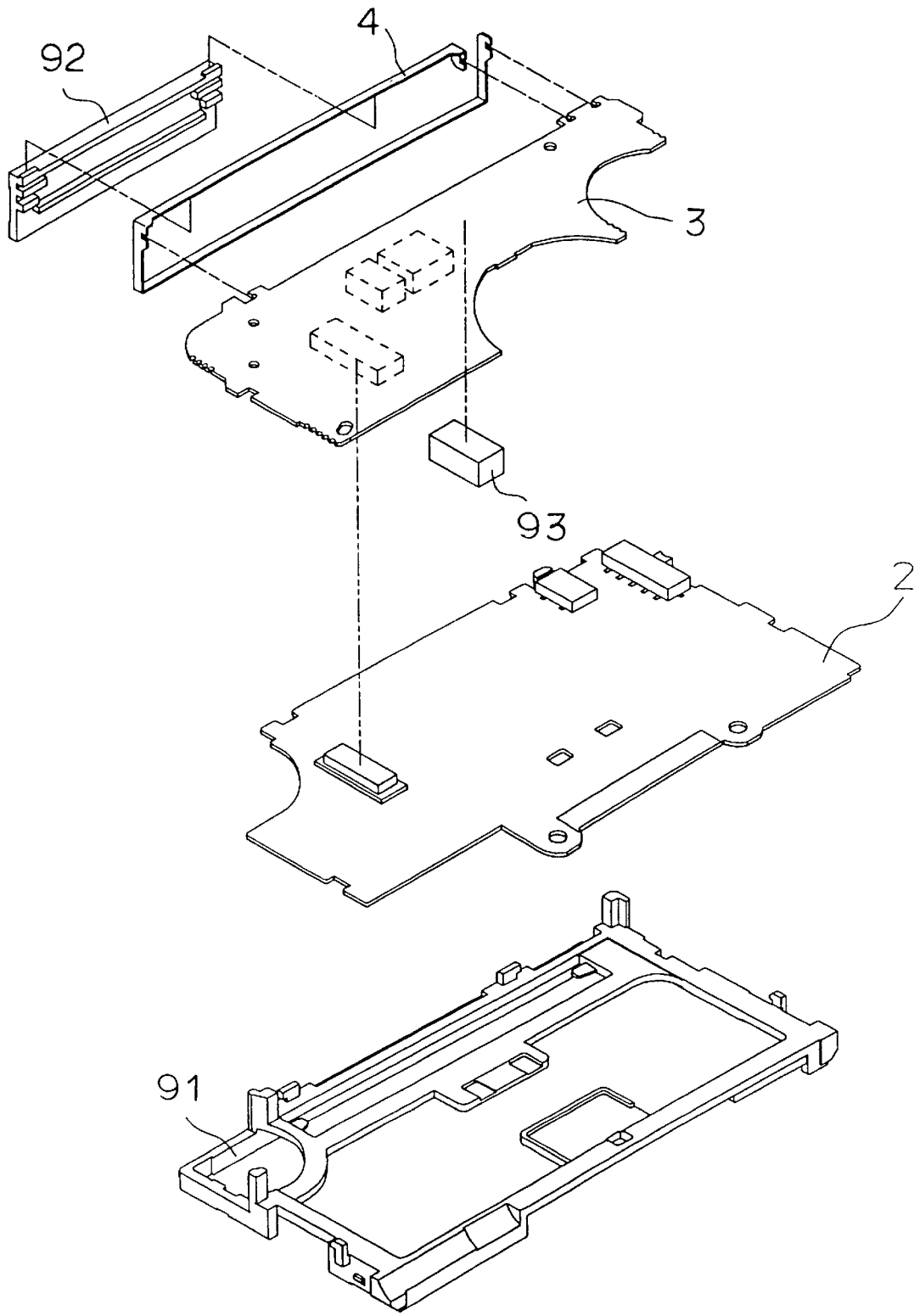
FIG. 2 is an exploded perspective view showing a retainer for an electronic apparatus according to the earlier development.

A retainer for an electronic apparatus which is the earlier development to the present invention is described with reference to FIG. 2. The retainer for an electronic apparatus of the earlier development includes housing member 91 in the form of a frame having a substantially rectangular shape in plan, loop antenna holding member 92 for supporting a loop antenna 4, and spacers 93 for assuring a distance between main printed board 2 on which electronic parts are to be mounted and other parts. Main printed board 2 and sub-printed board 3 are placed on the top surface of housing member 91 with spacer 93 interposed between them. Loop antenna 4 is mounted on sub-printed board 3. Loop antenna holding member 92 is assembled to main printed board 2 and sub-printed board 3. At this time, main printed board 2 and sub-printed board 3 are placed with spacer 93 interposed between them.

However, the retainer for an electronic part described above which is the earlier development to the present invention is disadvantageous in that, since it includes a large number of parts, a high total cost is required because a cost for the parts themselves, a cost for metal dies for production of the parts and a working cost required for assembly of the parts are required. The present invention has been made to overcome this disadvantage.

Figure 3:
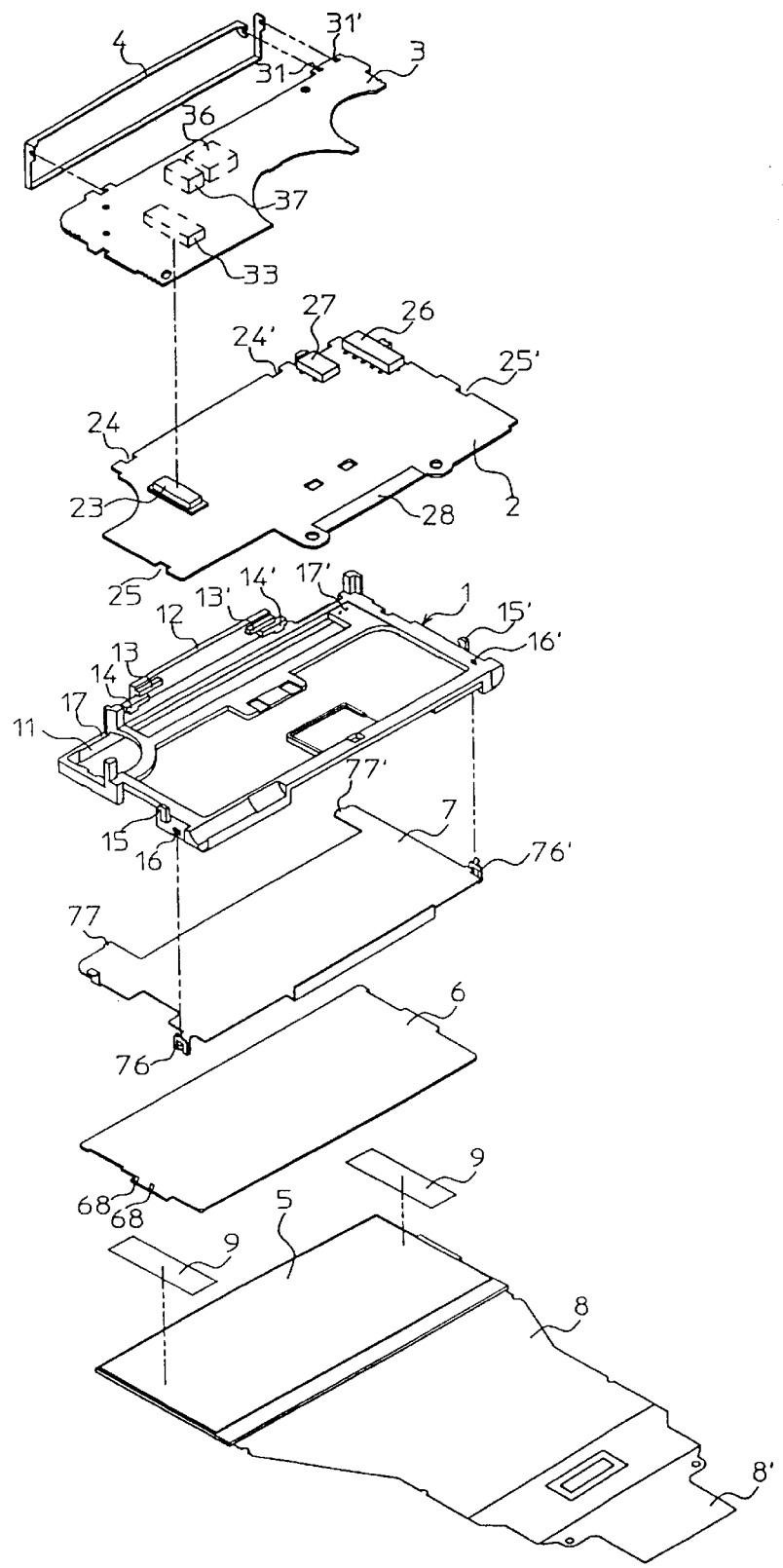
FIG. 3 is an exploded perspective view showing a retainer for an electronic apparatus as an embodiment of the present invention.
Figure 4:
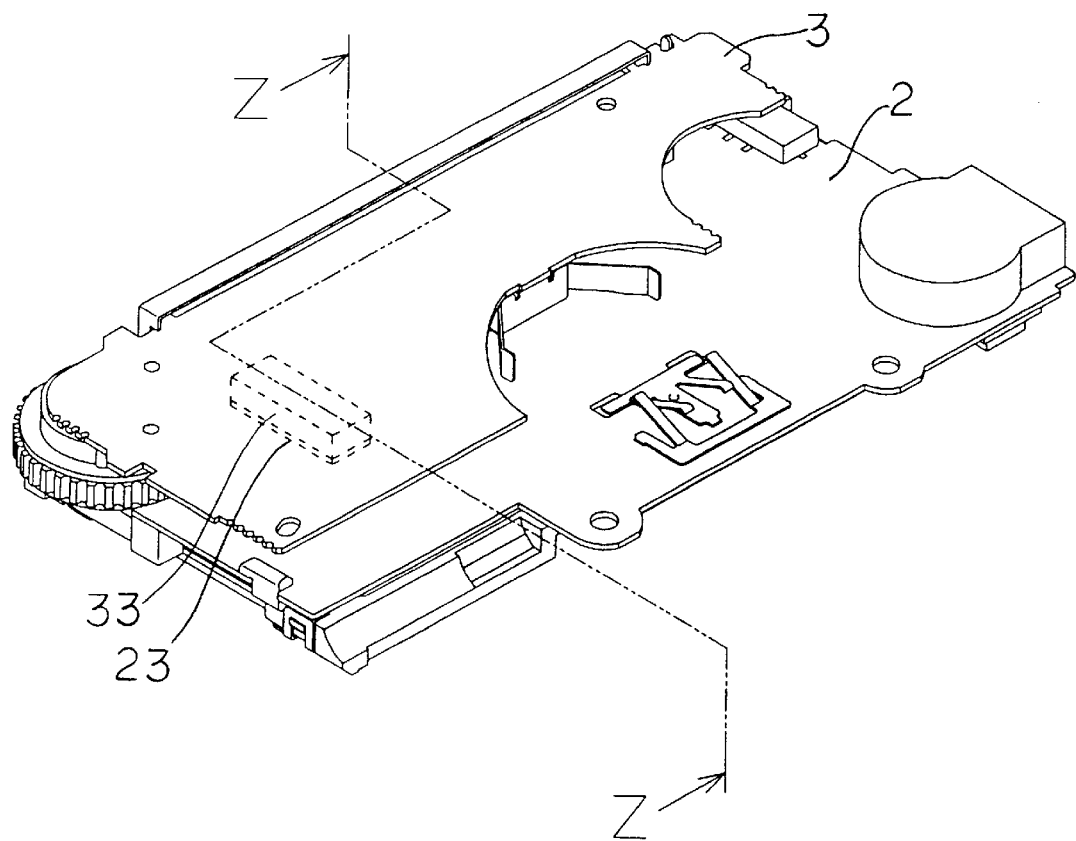
FIG. 4 is a perspective view of an appearance of the retainer for an electronic apparatus shown in FIG. 3 in a condition wherein a main printed board and a sub-printed board are assembled to the retainer for an electronic apparatus.
Figure 5:
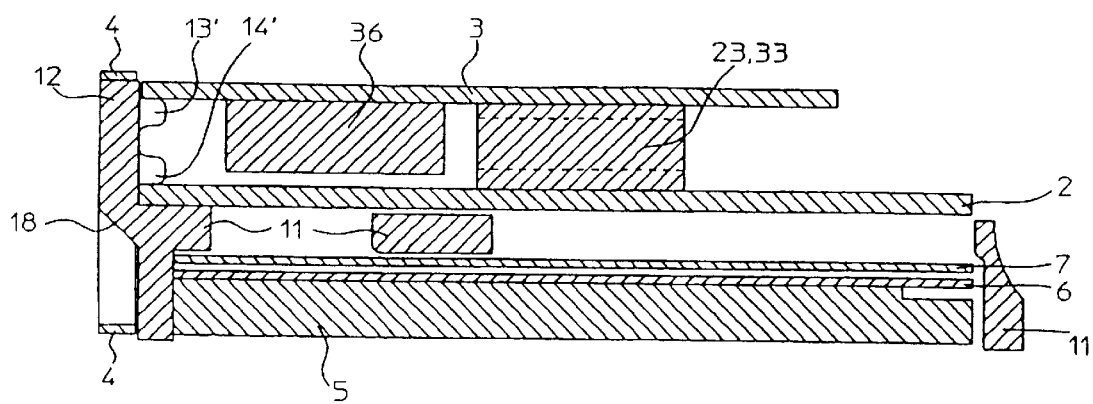
FIG. 5. is a sectional view taken along line Z—Z of the perspective view of the appearance of the retainer for an electronic apparatus shown in FIG. 4 in an assembled condition.

In the following, retainers for an electronic apparatus of embodiments of the present invention are described in detail with reference to the accompanying drawings. FIG. 3 is an exploded perspective view showing a retainer for an electronic apparatus as an embodiment of the present invention. FIG. 4 is a perspective view of an appearance of the retainer for an electronic apparatus shown in FIG. 3 in a condition wherein a main printed board and a sub-printed board are assembled to the retainer for an electronic apparatus. FIG. 5 is a sectional view taken along line Z—Z of the perspective view of the appearance of the retainer for an electronic apparatus shown in FIG. 4 in an assembled condition.

As shown in FIG. 3, retainer 1 for an electronic apparatus as an embodiment of the present invention includes housing member 11 in the form of a frame having a substantially rectangular shape in plan, antenna holding member 12 in the form of an elongated plate formed integrally with housing member 11 and extending perpendicularly to the plane of the frame from an outer side of one edge of the frame, rib elements 13, 13' provided in the proximity of the top end of antenna holding member 12 and extending inwardly for holding sub-printed board 3 placed thereon and assuring a distance between main printed board 2 and sub-printed board 3, and pawl elements 14, 14' provided on the top surface of housing member 11 for engaging with main printed board 2 to hold one end portion of main printed board 2. Further, housing member 11 includes a pair of hook elements 15, 15' provided in an opposing relationship to each other on the outer sides of two opposing edges perpendicular to the side of frame of housing member 11 on which antenna holding member 12 is mounted.

Antenna holding member 12 supports an inner side portion of loop antenna 4

Rib elements 13, 13' are provided at positions at which they keep the distance between sub-printed board 3 and main printed board 2 at a predetermined distance when one end portion of sub-printed board 3 is placed on rib elements 13, 13'.

Pawl elements 14, 14' engage, when main printed board 2 is placed on the top surface of housing member 11, with recesses 24, 24' provided on one edge of main printed board 2 to position the main printed board 2 on the top surface of housing member 11.

Hook elements 15, 15' are provided for engagement with recesses 25, 25' provided on opposing two edges of main printed board 2 in order to fix main printed board 2 placed on the top surface of housing member 11.

Further, protrusions 16, 16' for attaching metal bracket 7 in order to form housing member 11 in a shape like a box are provided in a parallel relationship to hook elements 15, 15' and in an opposing relationship to each other on the side of housing member 11 opposite to the side on which main printed board 2 is mounted. Insert slots 17, 17' are provided on the side of the frame of the housing member 11 on which antenna holding member 12 is provided.

Retainer 1 including housing member 11 formed in such a manner as described above is formed as one member of a resin material by injection molding. Preferably, a thermoplastic resin such as polycarbonate resin, which is comparatively tough particularly against an impact and is resilient is used as the resin material.

Housing member 11, in the form of a frame for retainer 1, is formed a little larger than EL (electroluminescent) lamp 6 and liquid crystal display unit 5 which is formed by LCD (Liquid Crystal Display) including a glass plate, in order to accommodate and hold them therein. EL lamp 6 illuminates liquid crystal display unit 5 from the back so that liquid crystal display unit 5 can be visually observed even in a dark place.

Sub-printed board 3 has two recesses 31, 31' formed therein by cutting away end portions thereof. Loop antenna 4 is fixed to recesses 31, 31' of sub-printed board 3 by soldering. Connector 23 is fixed to main printed board 2 by soldering. Another connector 33 is fixed to sub-printed board 3 by soldering. Main printed board 2 and sub-printed board 3 are held at the predetermined distance by mating connector 23 and connector 33 with each other. In a condition wherein connectors 23, 33 are mated in this manner, loop antenna 4 is held by antenna holding member 12. In this instance, since the end portion of sub-printed board 3 is seated on the rib elements 13, 13', the distance of loop antenna 4 from main printed board 2 can be kept fixed. Accordingly, even if an impact or the like is applied, the distance between main printed board 2 and sub-printed board 3 is not decreased easily because rib elements 13, 13' bear the impact of sub-printed board 3.

Electric parts 36, 37 (for example, ceramic parts) which are comparatively tall and comparatively weak against an impact or the like are mounted on sub-printed board 3 in the proximity of rib elements 13, 13'. Therefore, electric parts 36, 37 are prevented from being broken or damaged by collision with main printed board 2.

Now, an assembling method (procedure) and operation of retainer 1 according to the embodiment of present invention are described in detail with reference to FIG. 3. One terminal portion of heat seal 8 formed from a flexible thin film on which a large number of printed wiring lines are formed is connected to a terminal portion of liquid crystal display unit 5, and the other terminal portion 8' of heat seal 8 is connected to terminal portion 28 of main printed board 2. For the connection, thermocompression bonding or some other suitable method is employed.

Connector 23 is fixed by soldering to the surface of main printed board 2 opposite to the surface on which retainer 1 is to be attached. Further, while only a part is shown here, various electric parts 26, 27 and so forth which form a circuit of the electronic apparatus are mounted on the opposite surfaces of main printed board 2.

As a method of attaching main printed board 2 to retainer 1, recesses 24, 24' of main printed board 2 are first fitted with pawl elements 14, 14' of retainer 1, and then hook elements 15, 15' are fitted with recesses 25, 25' of main printed board 2 by making use of the resiliency of hook elements 15, 15' to fix main printed board 2. Then, in order to reinforce retainer 1 and form housing member 11 in the form of a frame so as to have a box-like shape, projections 77, 77' of metal bracket 7 formed from a thin plate made of a metal are inserted into insert slots 17, 17' of housing member 11 and then pawl elements 76, 76' of metal bracket 7 are hooked to protrusions 16, 16' of housing member 11 to mount metal bracket 7. Then, EL lamp 6 is accommodated into housing member 11 and terminal portion 68 of EL lamp 6 is connected to main printed board 2 by soldering or some other suitable means. Thereafter, liquid crystal display unit 5 and EL lamp 6 are fixed to each other by adhesive tape coated on both sides 9 and accommodated into housing member 11 of retainer 1.

Loop antenna 4 is fixed to the two recesses 31, 31' of sub-printed board 3 by soldering. Then, connector 33 is fixed by soldering to a position at which it can be mated with connector 23 of main printed board 2. Further, parts 36, 37 which are comparatively tall and are weak against a shock or the like are mounted by soldering or some other suitable means. In addition, though not shown, various electric parts which form the circuit of the electronic apparatus are mounted on the opposite surfaces of sub-printed board 3.

Figure 6A:
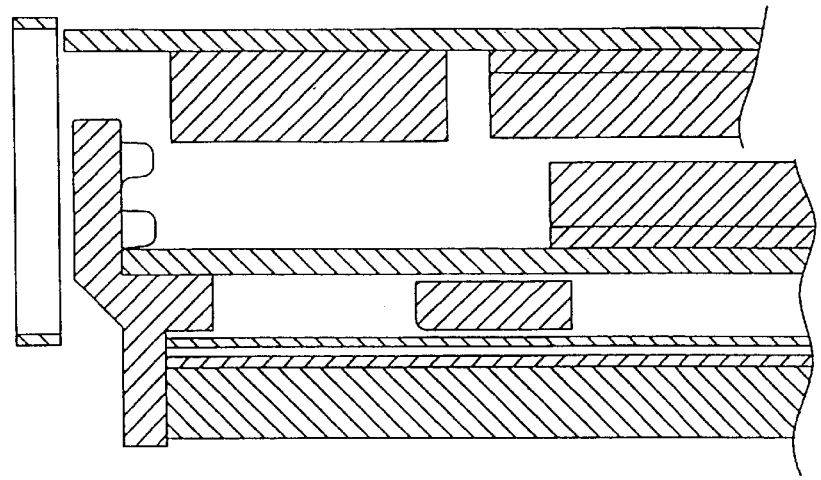
FIG. 6A is a partial sectional view taken along line Z—Z illustrating a condition before the sub-printed board and the main printed board are assembled to the retainer for an electronic apparatus shown in FIG. 4.
Figure 6B:
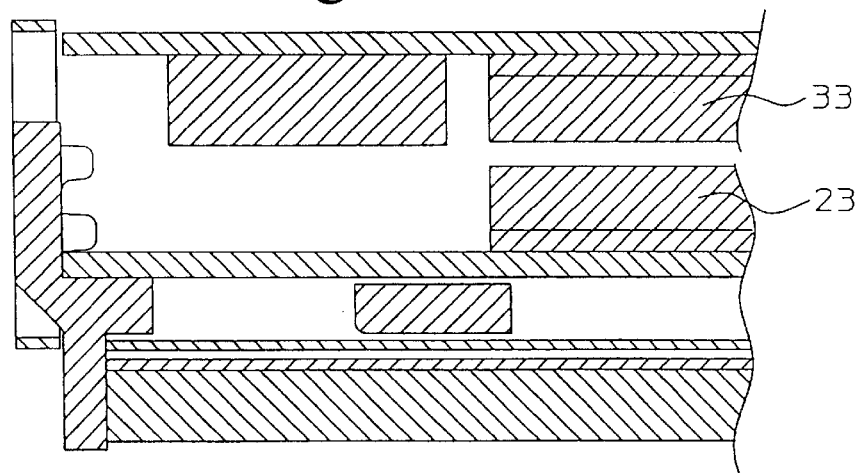
FIG. 6B is a partial sectional view taken along line Z—Z illustrating a condition wherein the sub-printed board is moved to a position at which a loop antenna surrounds an antenna holding member from the condition of FIG. 6A.
Figure 6C:
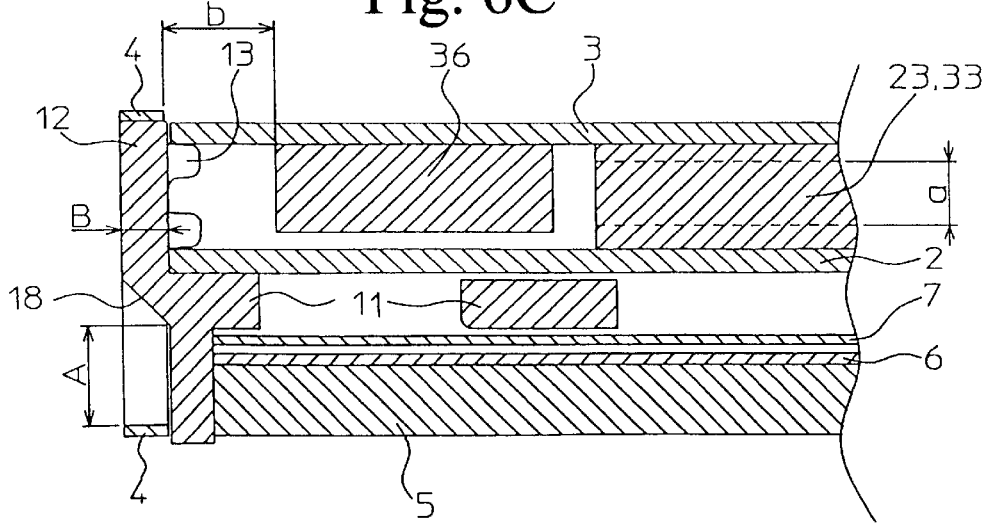
FIG. 6C is a partial sectional view taken along line Z—Z showing a condition after a connector of the main printed board and a connector of the sub-printed board are mated with each other from the condition of FIG. 6B and illustrating dimensional relationships of several parts.

The state after connectors 23, 33 of main printed board 2 and sub-printed board 3 have been mated with each other are described in detail with reference to FIGS. 4, 5 and 6A, 6B, 6C. FIG. 4 is a perspective view of an appearance of the retainer for an electronic apparatus shown in FIG. 3 in the state after the main printed board and sub-printed board have been assembled to the retainer for an electronic apparatus. FIG. 5 is a sectional view taken along line Z—Z of FIG. 4. FIGS. 6A, 6B, 6C are partial sectional views taken along line Z—Z illustrating the order in which the main printed board and the sub-printed board are assembled to the retainer for an electronic apparatus shown in FIG. 4 and their state after assembly. Further, relational dimensions of several parts are shown in FIG. 6C.

FIG. 6A shows the state before sub-printed board 3 and main printed board 2 have been assembled to the retainer for an electronic apparatus shown in FIG. 4.

FIG. 6B shows the state after sub-printed board 3 has been moved to a position at which loop antenna 4 surrounds antenna holding member 12 from the state of FIG. 6A.

FIG. 6C shows the state after connector 23 of main printed board 2 and connector 33 of sub-printed board 33 have been mated with each other from the state of FIG. 6B and shows dimensional relationships of several parts.

Dimension A of a portion of housing member 11 forming retainer 1 which is on the lower side of antenna holding member 12 is set larger than mating depth dimension a of connectors 23, 33, and inclined portion 18 is additionally provided on antenna holding member 12. The longitudinal dimensions of the lower side portion having dimension A and inclined portion 18 are required to be set larger than the longitudinal dimension of loop antenna 4. Further, thickness dimension B of antenna holding member 12 of retainer 1 is set smaller than distance dimension b from the end of loop antenna 4 to parts 36, 37 which are weak against an impact. The construction allows easy assembly of main printed board 2 and sub-printed board 3. On the other hand, main printed board 2 and sub-printed board 3 can be disassembled readily from each other because operation of connectors 23, 33 is merely reverse to that described above.

Now, the functioning of retainer 1 according to this embodiment of the present invention is described in detail. Since retainer 1 holds main printed board 2 by means of pawl elements 14, 14' and hook elements 15, 15' of retainer 1 itself, main printed board 2 can be assembled to and disassembled from retainer 1 readily. If retainer 1 and main printed board 2 are so structured that when retainer 1 to which the electronic apparatus is assembled is mounted in the housing, a principal portion of retainer 1 (for example, a side surface of housing member 11 or side surfaces of hook elements 15, 15') abuts against an inner wall of the housing, the retainer will not be displaced even by an impact from dropping or the like.

Further, antenna holding member 12 of retainer 1 holds loop antenna 4 thereon, and if loop antenna 4 is so structured that it abuts against the inner wall of the housing, then it serves as a support against a load applied thereto from the outside (a force applying location is either on a straight line or on one point), and this can increase the strength of loop antenna 4.

Besides, since rib elements 13, 13' of retainer 1 assure a fixed distance between main printed board 2 and sub-printed board 3, they can provide increased toughness against an impact or the like upon electric parts 36, 37 mounted in the proximity of rib elements 13, 13'.

Figure 7:
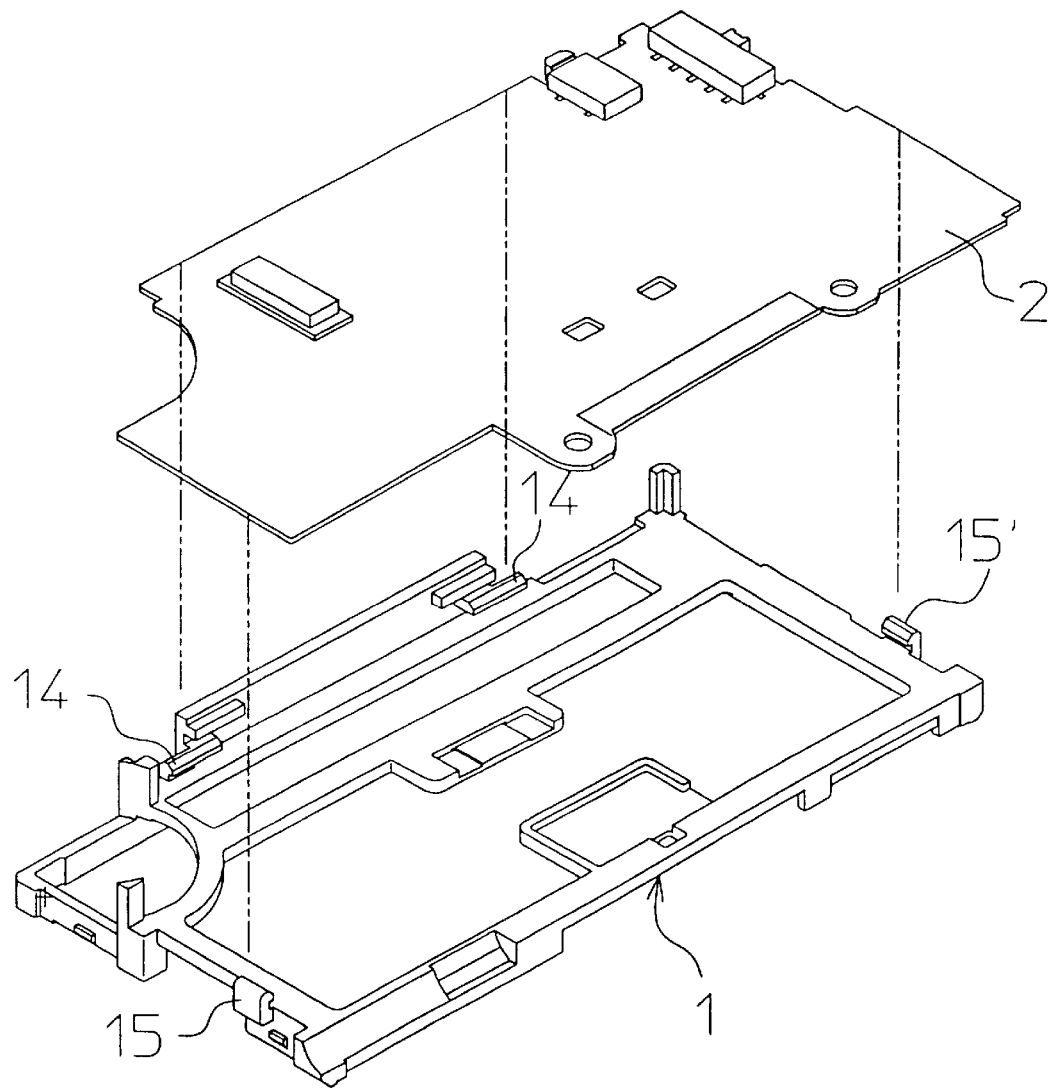
FIG. 7 is a perspective view showing essential part of a retainer for an electronic apparatus as another embodiment of the present invention.

Next, another embodiment of the present invention is described in detail with reference to the drawings. FIG. 7 is an exploded perspective view showing essential part of a retainer for an electronic apparatus as another embodiment of the present invention and a main printed board 2. FIG. 7 particularly shows another example of the shapes of pawl elements 14, 14' and hook elements 15, 15' of retainer 1. The shapes of pawl elements 14, 14' and hook elements 15, 15' are not specifically limited if they are so shaped that they can hold main printed board 2.

Figure 8:
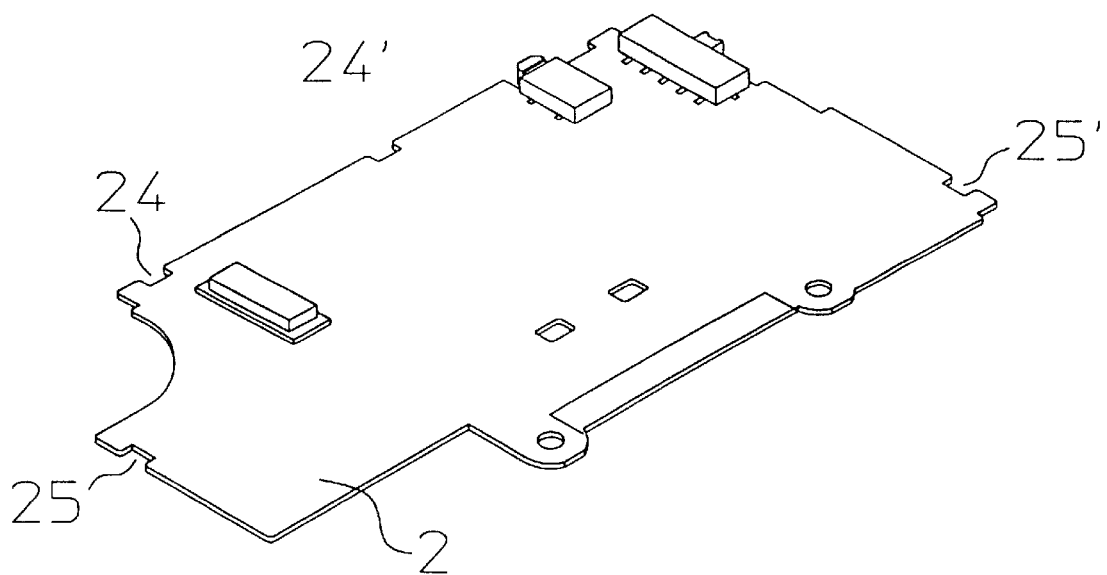
FIG. 8 is a perspective view showing essential part of a main printed board to be assembled to a retainer for an electronic apparatus of the present invention.

Further, as shown in FIG. 8, the positions of recesses 24, 24' and recesses 25, 25' provided at end portions of main printed board 2 to which pawl elements 14, 14' and hook elements 15, 15' of retainer 1 are attached are not limited specifically if they are within ranges of the end portions of main printed board 2.

Furthermore, as shown in FIG. 7, recesses for attaching pawl elements 14, 14' and hook elements 15, 15' need not be provided on main printed board 2. Moreover, while the numbers of pawl elements 14, 14' and hook elements 15, 15' described above are two, they are not limited specifically to two. Also the shape of loop antenna 4 is not limited specifically.

It is to be understood, however, that although the characteristics and advantages of the present invention have been set forth in the foregoing description, the disclosure is illustrative only, and changes may be made in the arrangement of the parts within the scope of the appended claims.

The entire disclosure of Japanese Patent Application No. 175034/98 filed on Jul. 22, 1998 including specification, claims, drawings and summary are incorporated herein by reference in its entirety.

What is claimed is:

1. A retainer for an electronic apparatus, comprising:
   a housing member in the form of a frame having a substantially rectangular shape in plan for accommodating and holding a display member;
   an antenna holding member positioned perpendicularly to said housing member in the form of a frame along the outer side of one edge of said housing member; and
   rib elements provided on said antenna holding member for assuring a distance between a main printed board and a sub-printed board both placed on said housing member;
   said housing member, said antenna holding member and said rib elements being formed as one unit of a resin material.

2. A retainer for an electronic apparatus according to claim 1, further comprising pawl elements formed on said housing member, said pawl elements being engaged with said main printed board to cause said housing member to hold said main printed board.

3. A retainer for an electronic apparatus according to claim 1, further comprising hook members formed on said housing, said hook members being engaged with said main printed board to cause said housing member to hold said main printed board.

* * * * *